United States Patent [19]

Reichert

[11] 4,324,814
[45] Apr. 13, 1982

[54] METHOD FOR FORMING A NARROW THIN FILM LINE

[75] Inventor: Walter F. Reichert, E. Brunswick, N.J.

[73] Assignee: RCA Corporation, New York, N.Y.

[21] Appl. No.: 245,589

[22] Filed: Mar. 19, 1981

[51] Int. Cl.³ ............................................. H01L 21/88
[52] U.S. Cl. ....................................... 427/86; 427/87; 427/88; 156/612; 156/656; 430/318
[58] Field of Search ............................ 427/86, 87, 88; 156/643, 656, 657, 662, 612, 613, 614; 430/312, 313, 318

[56] References Cited

U.S. PATENT DOCUMENTS 4,119,992  10/1978  Ipri et al. .................................. 357/4

OTHER PUBLICATIONS

C. O. Bozler et al., Fabrication and Numerical Simulation of the Permeable Base Transistor, IEEE Trans. Electron Devices, vol. ED-27, No. 6, Jun. 1980, pp. 1128-1141.

Primary Examiner—Ralph S. Kendall
Attorney, Agent, or Firm—Birgit E. Morris; Donald S. Cohen; Kenneth R. Glick

[57] ABSTRACT

A monocrystalline semiconductor substrate is provided, and a thin film pattern is defined on a surface thereof. An epitaxial layer is then grown on the substrate surface such that it overgrows the thin film pattern a predetermined distance. That portion of the thin film not covered by the epitaxial layer is then removed.

7 Claims, 4 Drawing Figures

METHOD FOR FORMING A NARROW THIN FILM LINE

The U.S. Government has rights in this invention pursuant to contract No. 79-6354.

BACKGROUND OF THE INVENTION

The present invention relates to a method for forming relatively narrow thin film lines. More particularly, the invention relates to a method for forming such lines on a semiconductor substrate.

In the fabrication of semiconductor devices, it is frequently desired to generate features having small physical dimensions. For example, narrow conductor lines having widths on the order of several microns are frequently utilized to interconnect various portions of a monolithic integrated circuit. The use of narrow interconnection lines allows larger areas of the integrated circuit to be devoted to actual devices, thereby achieving greater packing density. As a second example, relatively narrow lines are an objective when fabricating the gates of high frequency field effect transistors (FETs). Since FET frequency response relates to the inverse of channel length, and a narrow gate creates a narrow channel region, higher frequency switching can be achieved if narrow gate lines are used.

Lines having widths less than 1 micron can be fabricated using present semiconductor processing technology. However, elaborate, sophisticated and expensive photolithographic equipment and techniques must be resorted to. Electron beam or X-ray exposure systems are usually employed and other processing constraints are frequently created as well. Described herein is an invention which permits the fabrication of submicron width lines using relatively simple processing techniques.

SUMMARY OF THE INVENTION

A thin film line is first conventionally pattern generated on the surface of a substrate of suitable semiconductor meterial. An epitaxial layer is then grown on the substrate surface, the layer also growing laterally, over the thin film line, a predetermined distance. That portion of the thin film line not covered by the laterally grown epitaxial layer is then removed, so as to yield a relatively narrow thin film line covered by an epitaxial layer.

DETAILED DESCRIPTION

Figure 1:
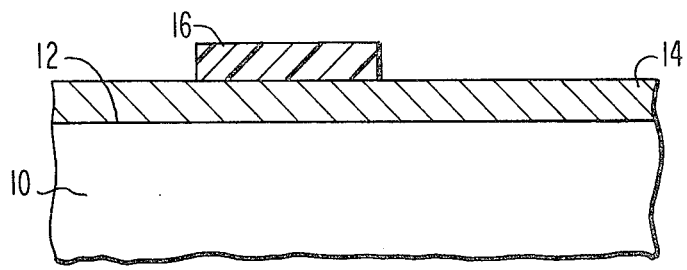
FIG. 1-4 illustrate the process sequence of the present invention.

As illustrated in FIG. 1, the starting point for the fabrication process of the present invention is a single crystalline semiconductor substrate 10 having a substantially planar surface 12. In the preferred embodiment, the substrate 10 is GaAs, although it is expected that single element semiconductors such as silicon, as well as other III-V binary semiconductor compounds and ternary or quaternary compounds, would be suitable as well. The crystallographic structure of the substrate 10 is cubic zinc-blende, and the surface 12 represents the (100) plane.

Figure 2:
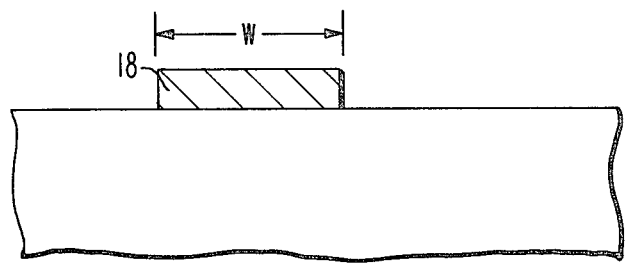

A relatively thin layer of a refractory material 14 is disposed on the planar surface 12, and a photoresist pattern 16 is then generated on the refractory layer 14. A refractory material is chosen because of its ability to withstand subsequent high temperature processing. In the preferred embodiment, the refractory layer 14 is tungsten or molybdenum approximately 100 to 1000 Angstroms in thickness and it can be deposited by conventional vacuum deposition methods. The photoresist pattern 16 can also be conventionally formed. For example, photoresist can be deposited by a spray, whirling or immersion technique, be patterned by selective exposure to a UV light source, and be developed by either spraying or immersing in a developing solution. Using the photoresist pattern 16 as a mask, the refractory layer 14 is selectively removed by conventional wet or dry etching techniques. The remaining photoresist 16 is then stripped, yielding a thin film pattern 18, as shown in FIG. 2.

The illustrated thin film pattern 18 is a line having a length which extends perpendicularly to the plane of the drawing, although the geometry of the pattern 18 is not limited to such an elementary structure. The width of the thin film pattern 18, designated W in FIG. 2, is governed by the capability of the specific processes used to generate the photoresist pattern 16 and selectively remove the layer 14. The described photolithographic process, as well as alternative conventional patterning techniques, such as selective evaporation through a mask, can conventionally delineate widths W on the order of several microns.

Figure 3:
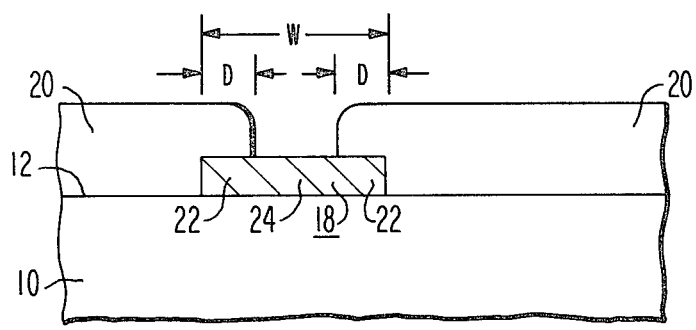

As illustrated in FIG. 3, an epitaxial layer 20 is now grown from the surface 12 of the substrate 10. In addition to growing outwardly from the surface 12, the epitaxial layer 20 grows laterally a distance D over the thin film pattern 18, thereby producing a covered thin film portion 22 and an uncovered portion 24. In a typical processing sequence the pattern 18 is 500 Angstroms thick and a GaAs epitaxial layer 20 is grown to approximately 1500 Angstroms, measured from the surface 12. When the epitaxial growth temperature is 720° C., a lateral overgrowth distance D of 0.5 μm can be achieved in approximately 8 seconds.

Figure 4:
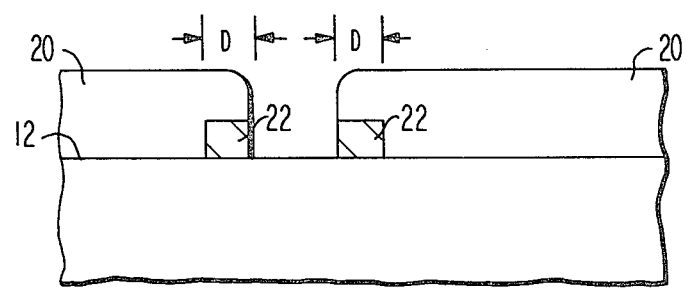

The uncovered portion 24 of the thin film pattern 18 is then removed, as illustrated in FIG. 4. This removal can be performed by conventional techniques, such as either chemical or plasma etching, and it will yield a thin film feature having a relatively narrow width D. Although this is the last illustrated processing step in the drawing, it should be recognized that a variety of subsequent operations, depending on the particular application of the invention, will typically be performed as well. For example, the epitaxial layer 20 might next be stripped from the substrate surface 12 or a portion of the narrow line 22 and its overlying epitaxial layer 20 can next be selectively stripped from the surface 12.

The present invention thus provides a technique for fabricating a line of submicron width on a GaAs substrate. The process might be used, for example, to form an interconnection pattern on the GaAs surface 12, as described in copending U.S. patent application Ser. No. 210,250, MONOLITHIC INTEGRATED CIRCUIT INTERCONNECTION AND FABRICATION METHOD, W. F. Reichert, filed Nov. 25, 1980. Semi-insulating GaAs is a frequently used substrate material for semiconductor devices which are to be operated at high (e.g. RF or microwave) frequencies, and devices made by the process described herein are particularly suitable for such applications.

What is claimed is:

1. A method for forming a narrow thin film line, comprising:
   providing a monocrystalline semiconductor substrate;
   forming a thin film pattern on a surface of said substrate;
   growing an epitaxial layer on said surface, said layer growing laterally, over the thin film pattern, a predetermined distance; and
   removing that portion of the thin film not covered by the epitaxial layer.

2. A method in accordance with claim 1 wherein the thin film pattern is formed by the steps of:
   depositing a layer of refractory material; and
   photolithographically defining a pattern in said layer.

3. A method in accordance with claim 2, wherein:
   the refractory material is selected from the group consisting of tungsten and molybdenum.

4. A method in accordance with claim 1, wherein:
   the thin film pattern is approximately 500 Angstroms thick; and
   the predetermined distance is approximately $0.5\mu$.

5. A method in accordance with claim 1, wherein:
   the substrate is of cubic zinc-blende structure.

6. A method in accordance with claim 5, wherein:
   the substrate is GaAs.

7. A method in accordance with claim 5, wherein:
   the substrate surface is the (100) crystallographic plane.

* * * * *